(12) United States Patent
Fukuda

(10) Patent No.: US 8,552,805 B2
(45) Date of Patent: Oct. 8, 2013

(54) PIEZOELECTRIC VIBRATOR, METHOD OF MANUFACTURING PIEZOELECTRIC VIBRATOR, OSCILLATOR, ELECTRONIC EQUIPMENT AND RADIO-CONTROLLED TIMEPIECE

(75) Inventor: Junya Fukuda, Chiba (JP)

(73) Assignee: Seiko Instruments Inc., Chiba (JP)

( * ) Notice: Subject to any disclaimer, the term of this patent is extended or adjusted under 35 U.S.C. 154(b) by 268 days.

(21) Appl. No.: 13/035,575

(22) Filed: Feb. 25, 2011

(65) Prior Publication Data

US 2011/0140796 A1 Jun. 16, 2011

Related U.S. Application Data

(63) Continuation of application No. PCT/JP2008/065251, filed on Aug. 27, 2008.

(51) Int. Cl.
*H01L 41/22* (2013.01)
*H01L 41/053* (2006.01)
*H03H 9/215* (2006.01)

(52) U.S. Cl.
USPC .......... 331/156; 310/370; 310/344; 310/348; 29/25.35; 331/68

(58) Field of Classification Search
USPC ............ 331/156, 158, 68; 310/370, 344, 348; 29/25.35
See application file for complete search history.

(56) References Cited

U.S. PATENT DOCUMENTS

| 8,087,135 | B2 * | 1/2012 | Ouchi et al. | 29/25.35 |
| 8,148,875 | B2 * | 4/2012 | Aratake | 310/312 |
| 8,179,021 | B2 * | 5/2012 | Fukuda | 310/344 |
| 8,212,454 | B2 * | 7/2012 | Onitsuka et al. | 310/348 |
| 8,304,965 | B2 * | 11/2012 | Aratake et al. | 310/344 |

FOREIGN PATENT DOCUMENTS

| JP | 53-149794 A | 12/1978 |
| JP | 2003-142976 A | 5/2003 |
| JP | 2007-311914 A | 11/2007 |

OTHER PUBLICATIONS

International Search Report for International Application No. PCT/JP2008/065251, dated Nov. 4, 2008, 1 page.

* cited by examiner

*Primary Examiner* — Joseph Chang
(74) *Attorney, Agent, or Firm* — Brinks Hofer Gilson & Lione

(57) ABSTRACT

A piezoelectric vibrator includes a tuning fork type piezoelectric vibrating reed including a pair of vibration arm portions; a package that accommodates the piezoelectric vibrating reed; and a getter material that is formed along the longitudinal direction of the vibration arm portion in an inner portion of the package, wherein a cross-sectional area of a middle portion of the getter material adjacent to a center portion of the longitudinal direction of the vibration arm portion is greater than that of an end portion of the getter material.

9 Claims, 15 Drawing Sheets

P-P

Q-Q

R-R

PIEZOELECTRIC VIBRATOR, METHOD OF MANUFACTURING PIEZOELECTRIC VIBRATOR, OSCILLATOR, ELECTRONIC EQUIPMENT AND RADIO-CONTROLLED TIMEPIECE

RELATED APPLICATIONS

This application is a continuation of PCT/JP2008/065251 filed on Aug. 27, 2008. The entire content of this application is incorporated herein by reference.

TECHNICAL FIELD

The present invention relates to a Surface Mount Device Type (SMD) piezoelectric vibrator in which a piezoelectric vibrating reed is sealed in a cavity formed between two joined substrates, a piezoelectric vibrator manufacturing method to manufacture the piezoelectric vibrator, an oscillator, electronic equipment and a radio-controlled timepiece having the piezoelectric vibrator.

BACKGROUND ART

In recent years, piezoelectric vibrators using a piezoelectric vibrating reed formed of a piezoelectric material such as crystals or the like have been used in mobile phones or personal digital assistants, as time sources or timing sources such as control signals, or reference signal sources and the like. As the piezoelectric vibrating reed, a tuning fork type piezoelectric vibrating reed including a pair of vibration arm portions has been adopted.

As this type of piezoelectric vibrator, a Surface Mount Device (SMD) type piezoelectric vibrator is known.

FIG. 16 is a plane view of a state in which a lid substrate of a surface mount type piezoelectric vibrator according to the related art is removed, and FIG. 17 is a cross-sectional view taken from line C-C of FIG. 16. As shown in FIG. 17, as an SMD type piezoelectric vibrator 200, a piezoelectric vibrator, in which a package 209 is formed by a base substrate 201 and a lid substrate 202 and a piezoelectric vibrating reed 203 is received in a cavity C formed in an inner portion of the package 209, is suggested. The base substrate 201 and the lid substrate 202 are bonded to each other by anode bonding by arranging a bonding film 207 therebetween.

Generally, it is desired that a piezoelectric vibrator suppresses the equivalent resistance value (effective resistance value, Re) to a lower level. Since a piezoelectric vibrator having a low equivalent resistance value can vibrate the piezoelectric vibrating reed using less electric power, it is a more energy efficient piezoelectric vibrator.

As a general method of suppressing the equivalent resistance value, a method of making the inside of the sealed cavity C of the piezoelectric vibrating reed 203 closer to a vacuum shown in FIG. 16 is known, thereby lowering a series resonance resistance value (R1) that has a proportional relationship with the equivalent resistance value. As a method of making the inner portion of the cavity C closer to a vacuum, there is a known method (known as gettering) of sealing a getter material 220 formed of aluminum or the like in the cavity C and irradiating laser from the outside to activate the getter material 220 (see Patent Document 1). According to this method, since oxygen generated during anode bonding can be absorbed by the getter material 220 entering the activation state, the inner portion of the cavity C can be made closer to a vacuum.

[Patent Citation 1] JP-A-2003-142976

SUMMARY OF THE INVENTION

The getter material 220 is formed at both outer sides of a pair of vibration arm portions 210 along the longitudinal direction of the vibration arm portions 210 that is a width direction of the piezoelectric vibrating reed 203. There is a problem in that, upon gettering the getter material 220, byproducts can be attached to the vibration arm portions 210 and the frequency of the piezoelectric vibrating reed 203 is changed.

In addition, after the gettering process, generally, a metallic weight material 211 provided in a front end of the vibration arm portion 210 is irradiated with laser and the metallic heavy metal material 211 is trimmed to perform minute regulation (minute regulation process) of the frequency of the piezoelectric vibrating reed 203. However, in the gettering process, when the frequency is widely changed, it is difficult or impossible to limit the frequency of the piezoelectric vibrating reed 203 within the range of the nominal frequency in the minute regulation process.

The invention has been made in view of the above circumstances, and an object thereof is to provide a piezoelectric vibrator and a method of manufacturing the same that can suppress any fluctuations in frequency due to the gettering.

The inventors of the invention acquired the following technique by testing. When performing the gettering in an area adjacent to the front end portion of the vibration arm portion of the piezoelectric vibrating reed, the product due to the gettering is mainly attached to the front end portion of the vibration arm portion. In this case, since the weight (corresponding to the mass of a spring-mass system) of the front end portion increases, the frequency of the piezoelectric vibrating reed is lowered. On the other hand, when performing the gettering in an area adjacent to the proximal end portion of the vibration arm portion, the product is mainly attached to the proximal end portion of the vibration arm portion. In this case, an increase in rigidity (corresponding to a spring constant of the spring-mass system) of the proximal end portion is dominant, and the frequency of the piezoelectric vibrating reed increases. On the other hand, when performing the gettering in an area adjacent to a center portion of the vibration arm portion of the piezoelectric vibrating reed, the product is mainly attached to the center portion of the vibration arm portion. In this case, the product is attached somewhere in between the abovementioned, and the frequency of the piezoelectric vibrating reed is not changed.

Thus, a piezoelectric vibrator according to the invention adopts the following means:

That is, the piezoelectric vibrator includes a tuning fork type piezoelectric vibrating reed including a pair of vibration arm portions, a package that accommodates the piezoelectric vibrating reed, and a getter material that is formed along the longitudinal direction of the vibration arm portion in an inner portion of the package, wherein a cross-sectional area of a middle portion of the getter material adjacent to the center portion of the longitudinal direction of the vibration arm portion is greater than that of an end portion of the getter material.

According to the configuration, only by gettering the middle portion, a great quantity of getter material can be activated, and the degree of vacuum in the package can be secured. In addition, only by gettering the middle portion, the product due to the gettering is mainly attached to the center portion of the vibration arm portion. Thus, it is possible to suppress any fluctuations in frequency due to the gettering.

Furthermore, it is desirable that the width of the middle portion of the getter material is greater than that of the end portion of the getter portion.

Moreover, it is desirable that the thickness of the middle portion of the getter material is greater than that of the end portion of the getter material.

According to this configuration, the cross-section area of the middle portion of the getter material can be made greater than that of the end portion of the getter material.

Furthermore, it is desirable that the getter material is arranged at the outside of the pair of vibration arm portions in the width direction of the piezoelectric vibrating reed and that the distance from the vibration arm portion to the end portion of the getter material is greater than that from the vibration arm portion to the middle portion of the getter material.

According to the configuration, the end point of the getter material can be gettered in a position separated from the vibration arm portion, and it is possible to suppress the product from being attached to the front end portion or the proximal end portion of the vibration arm portion. Thus, any fluctuations in frequency due to the gettering can be suppressed.

Furthermore, a piezoelectric vibrator according to the invention includes a tuning fork type piezoelectric vibrating reed including a pair of vibration arm portions extending from a base portion, a package that accommodates the piezoelectric vibrating reed, and a getter material that is formed around the base portion in an inner portion of the package.

According to the configuration, the product due to the gettering can be attached to the base portion of the piezoelectric vibrating reed and it is possible to suppress the product from being attached to the front end portion or the proximal end portion of the vibration arm portion. Thus, any fluctuations in frequency due to the gettering can be suppressed.

On the other hand, a method of manufacturing the piezoelectric vibrator according to the invention is characterized by a method of manufacturing a tuning fork type piezoelectric vibrating reed including a pair of vibration arm portions, a package that accommodates the piezoelectric vibrating reed, and a getter material that is formed along the longitudinal direction of the vibration arm portion in an inner portion of the package, by a first gettering process of activating a middle portion of the getter material adjacent to a center portion of the longitudinal direction of the vibration arm portion, and by a second gettering process of activating an end portion of the getter material.

According to the configuration, since the first gettering process of activating the middle portion is performed in advance, it is possible to attach the product due to the gettering as near the center portion of the vibration arm portion as possible. Thus, any fluctuations in frequency due to the gettering can be suppressed.

Furthermore, in the second gettering process, it is desirable to activate both end portions of the getter material so as to be axisymmetric to the center line of the longitudinal direction of the vibration arm portion.

According to the configuration, the product due to the gettering can be evenly attached to the front end portion and the proximal end portion of the vibration arm portion. As a result, any increases or decreases in frequency due to the gettering can be offset, and any fluctuations in frequency can be suppressed.

On the other hand, an oscillator according to the invention is configured so that the above-mentioned piezoelectric vibrator is electrically connected to an integrated circuit as an oscillating element.

Furthermore, the electronic equipment according to the invention is configured so that the above-mentioned piezoelectric vibrator is electrically connected to a measurement portion.

Furthermore, the radio-controlled timepiece according to the invention is configured so that the above-mentioned piezoelectric vibrator is electrically connected to a filter portion.

Since the above-mentioned piezoelectric vibrator can suppress any fluctuations in frequency due to the gettering, the frequency of the piezoelectric vibrator can be limited to the range of the nominal frequency and the throughput can be improved. Thus, the cost of the oscillator, the electric equipment, and the radio-controlled timepiece can be reduced.

With regard to the piezoelectric vibrator according to the invention, only by gettering the middle portion, a great quantity of getter material can be activated, and the degree of vacuum in the package can be secured. In addition, only by gettering the middle portion, the product due to the gettering is mainly attached to the center portion of the vibration arm portion. Thus, it is possible to suppress any fluctuations in frequency due to the gettering.

Furthermore, according to the manufacturing method of the piezoelectric vibrator, since the first gettering process of activating the middle portion is performed in advance, it is possible to attach the product due to the gettering as near the center portion of the vibration arm portion as possible. Thus, any fluctuations in frequency due to the gettering can be suppressed.

DETAILED DESCRIPTION OF THE PREFERRED EMBODIMENTS

Hereinafter, an embodiment according to the invention will be explained with reference to the attached drawings.

Figure 1:
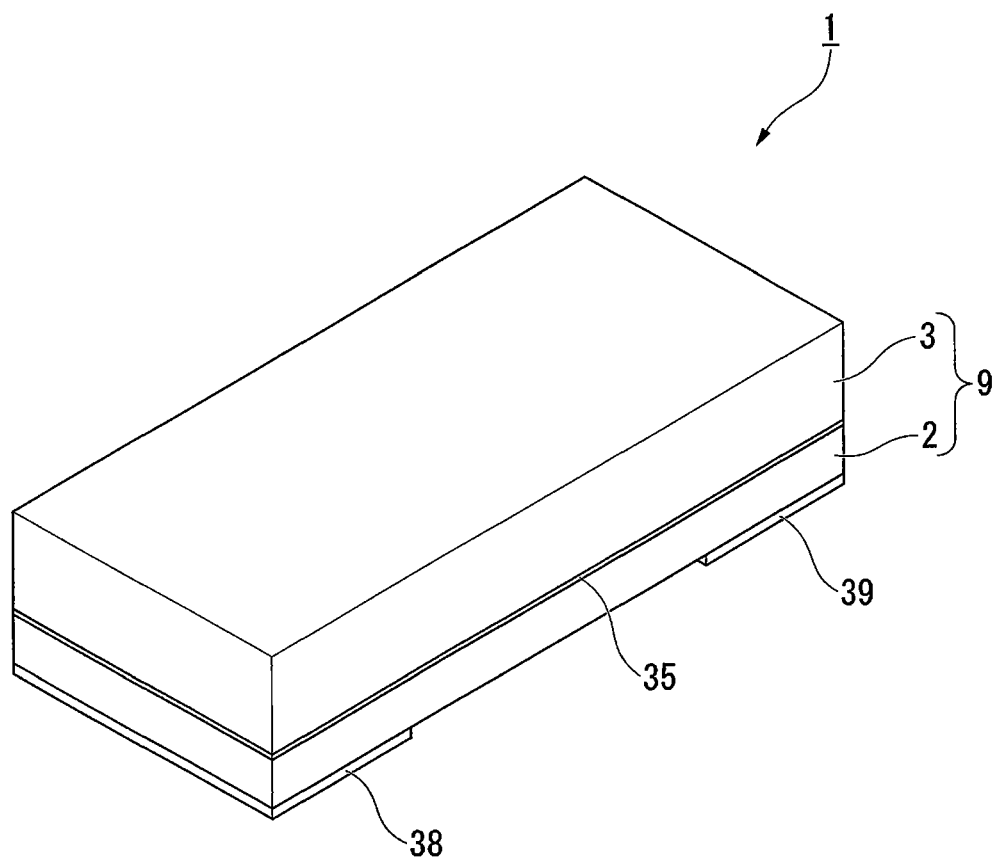
FIG. 1 is an exterior perspective view of a piezoelectric vibrator according to a first embodiment.
Figure 2:
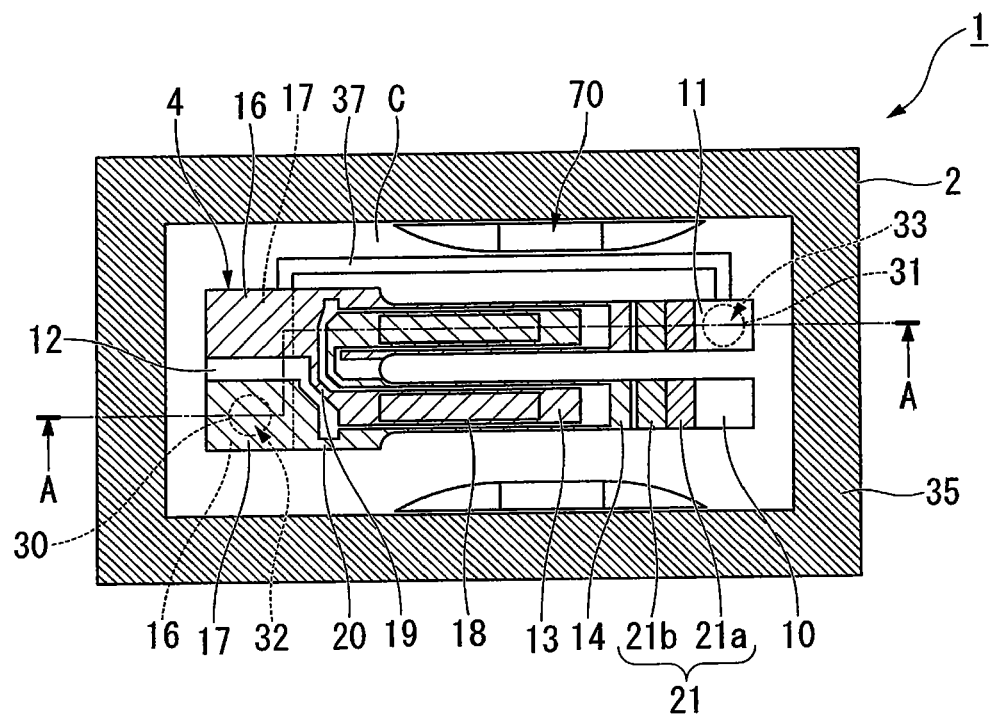
FIG. 2 is an inner configuration diagram of the piezoelectric vibrator shown in FIG. 1 which shows a piezoelectric vibrating reed with a lid substrate removed therefrom seen from above.
Figure 3:
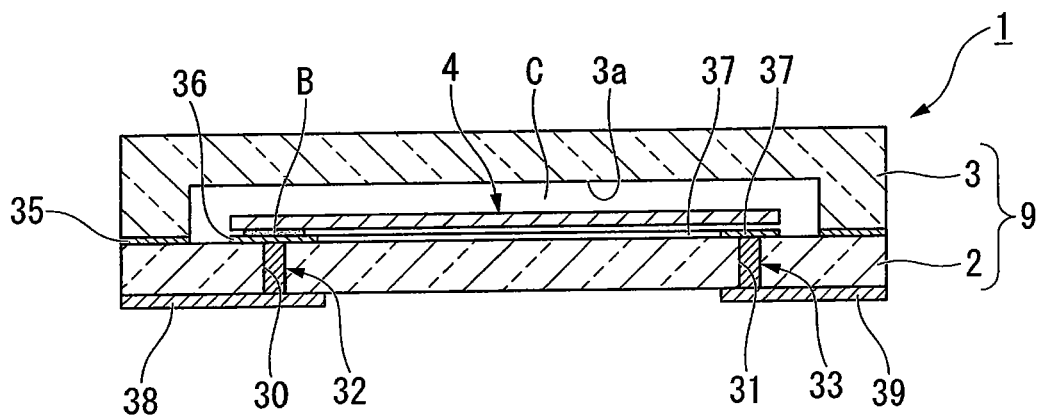
FIG. 3 is a cross-sectional view of the piezoelectric vibrator taken along line A-A shown in FIG. 2.
Figure 4:
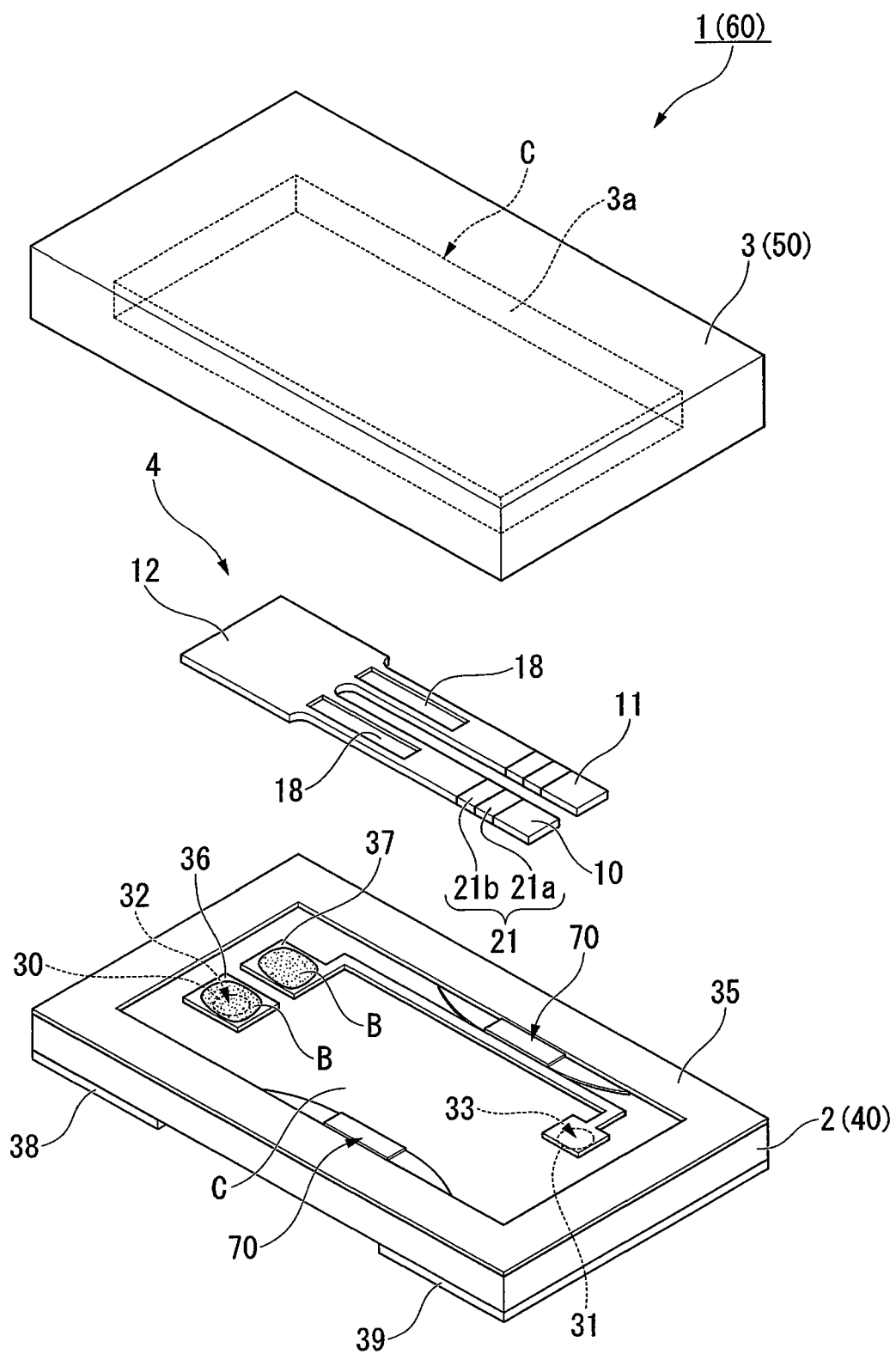
FIG. 4 is an exploded perspective view of the piezoelectric vibrator shown in FIG. 1.

FIG. 1 is an exterior perspective view of a piezoelectric vibrator according to the invention. FIG. 2 is an inner configuration diagram of the piezoelectric vibrator shown in FIG. 1 which shows a piezoelectric vibrating reed with a lid substrate removed seen from above. FIG. 3 is a cross-sectional view of the piezoelectric vibrator taken along line A-A of FIG. 2. FIG. 4 is an exploded perspective view of the piezoelectric vibrator. In FIG. 4, in order to make the drawing easier to see, an excitation electrode 15 of the piezoelectric vibrating reed, lead-out electrodes 19 and 20, mount electrodes 16 and 17, and a heavy metal film 21 are omitted.

As shown in FIGS. 1 to 4, the piezoelectric vibrator 1 of the present embodiment includes a package 9 in which the base substrate 2 and the lid substrate 3 are stacked in two layers, and is a surface mount type piezoelectric vibrator 1 in which the piezoelectric vibrating reed 4 is accommodated in a cavity C of an inner portion of the package 9.

(Piezoelectric Vibrating Reed)

Figure 5:
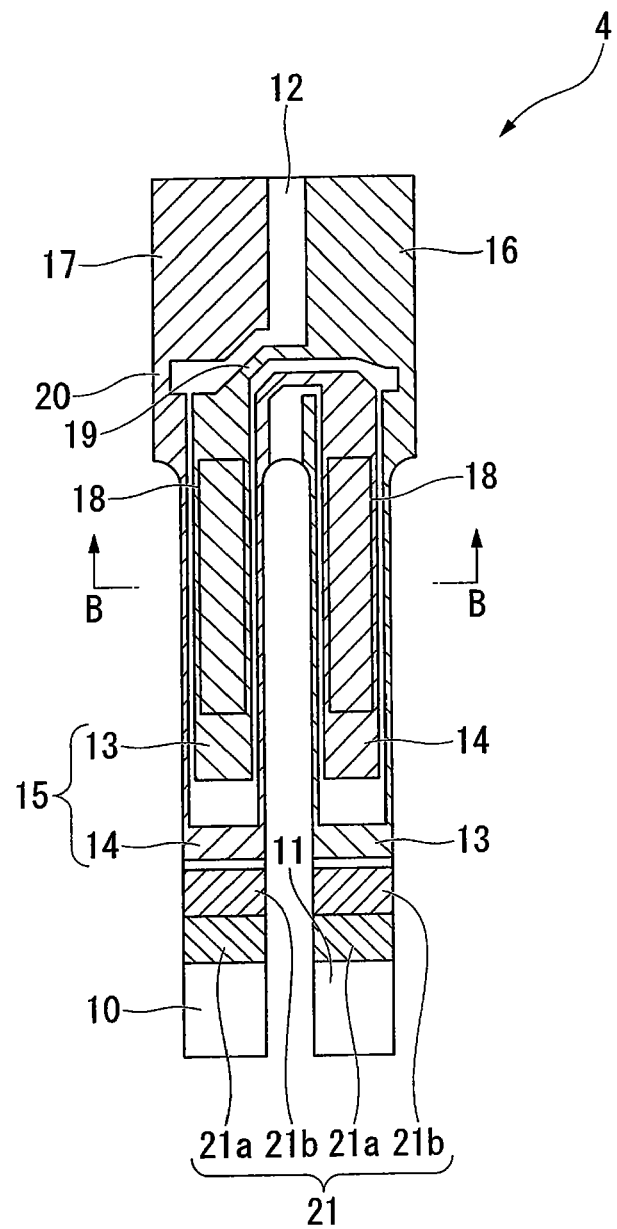
FIG. 5 is a plane view of a piezoelectric vibrating reed constituting the piezoelectric vibrator shown in FIG. 1.
Figure 6:
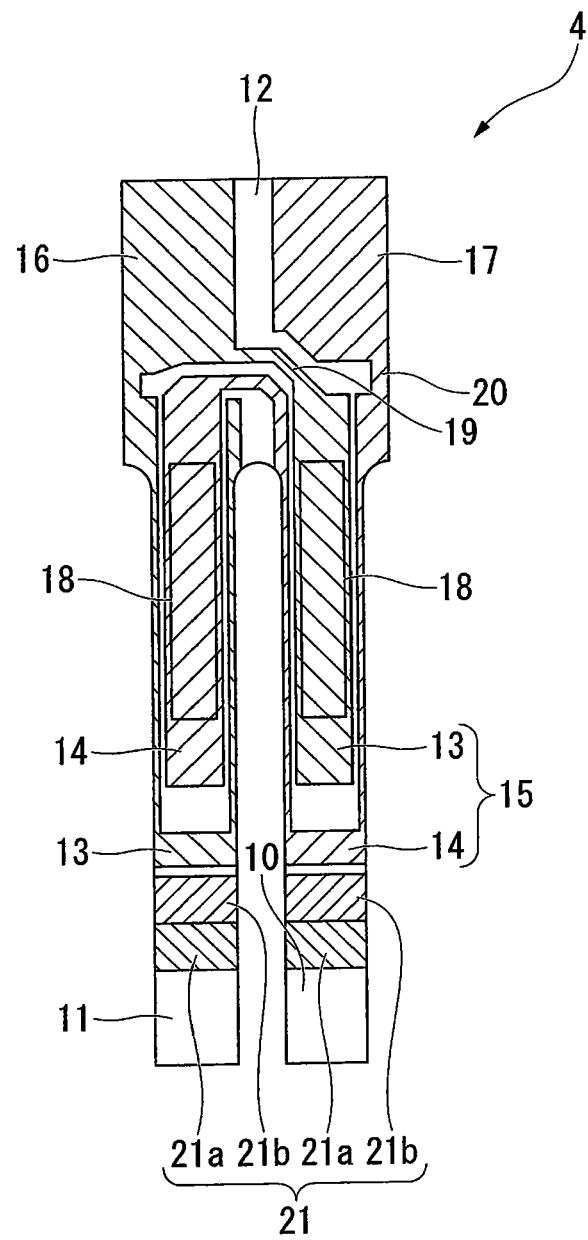
FIG. 6 is a bottom view of the piezoelectric vibrating reed shown in FIG. 5.
Figure 7:
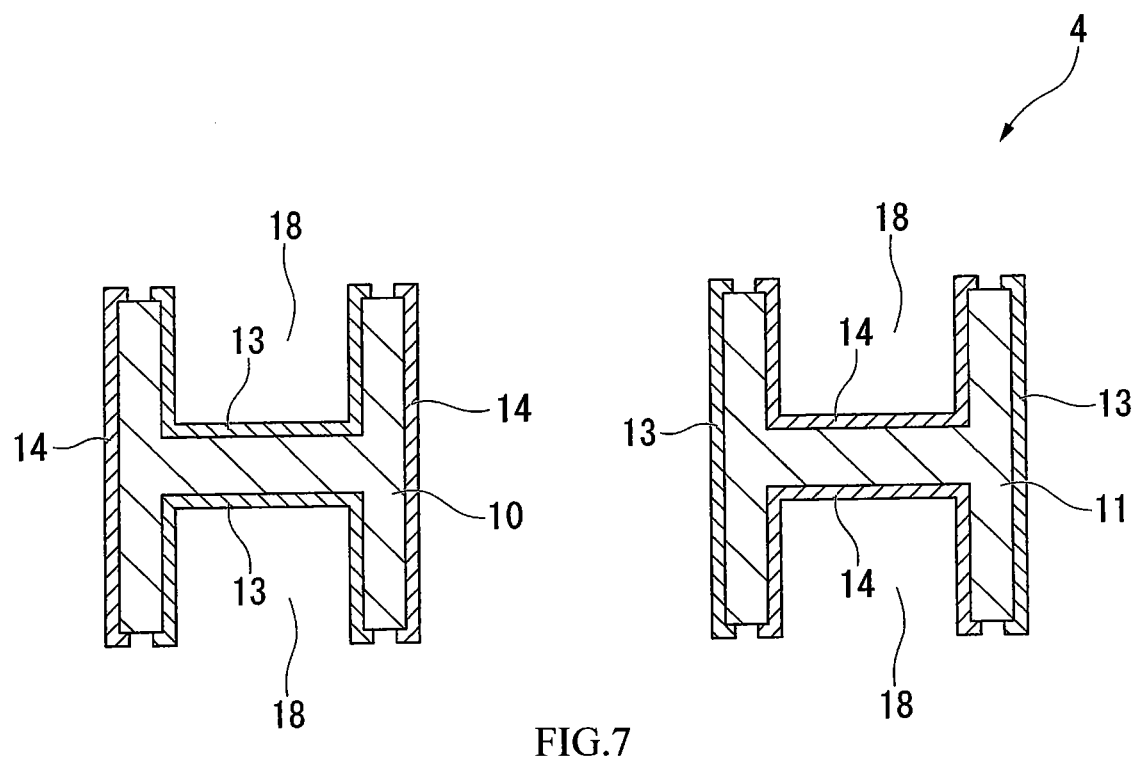
FIG. 7 is a cross-sectional view taken from line B-B of FIG. 5.

FIG. 5 is a plane view of a piezoelectric vibrating reed, FIG. 6 is a bottom view of the piezoelectric vibrating reed, and FIG. 7 is a cross-sectional view taken from line B-B of FIG. 5.

As shown in FIGS. 5 to 7, the piezoelectric vibrating reed 4 is a tuning fork type vibrating reed formed of piezoelectric materials such as crystal, lithium tantalite and lithium niobate, and is vibrated when a predetermined voltage is applied. The piezoelectric vibrating reed 4 has a pair of vibration arm portions 10 and 11 arranged in parallel, a base portion 12 that integrally fixes proximal end sides of the pair of vibration arm portions 10 and 11, an excitation electrode 15 including a first excitation electrode 13 and a second excitation electrode 14 that is formed on outer surfaces the pair of vibration arm portions 10 and 11 to vibrate the pair of vibration arm portions 10 and 11, and mount electrodes 16 and 17 that are electrically connected to the first excitation electrode 13 and the second excitation electrode 14. In addition, the piezoelectric vibrating reed 4 includes groove portions 18 that are formed on both main surfaces of the pair of vibration arm portions 10 and 11 along the longitudinal direction of the vibration arm portions 10 and 11, respectively. The groove portions 18 are formed from the proximal end sides of the vibration arm portions 10 and 11 up to approximately near a middle portion thereof.

The excitation electrodes 15 including the first excitation electrode 13 and the second excitation electrode 14 are electrodes that vibrate the pair of vibration arm portions 10 and 11 in a direction approaching or retracting each other by a predetermined resonant frequency, and are patterned and formed on the outer surfaces of the pair of vibration arm portions 10 and 11 in a state of being electrically separated, respectively. Specifically, the first excitation electrode 13 is mainly formed on the groove portion 18 of one vibration arm portion 10 and on both side surfaces of the other vibration arm portion 11, and the second excitation electrode 14 is mainly formed on both side surfaces of one vibration arm portion 10 and on the groove portion 18 of the other vibration arm portion 11.

Furthermore, the first excitation electrode 13 and the second excitation electrode 14 are electrically connected to the mount electrodes 16 and 17 via lead-out electrodes 19 and 20 on both main surfaces of the base portion 12, respectively. Moreover, the voltage is applied to the piezoelectric vibrating reed 4 via the mount electrodes 16 and 17. In addition, the excitation electrode 15, the mount electrodes 16 and 17 and the lead-out electrodes 19 and 20 are formed, for example, by the coating of conductive films such as chromium (Cr), nickel (Ni), aluminum (Al) or titanium (Ti).

Furthermore, on the front ends of the pair of vibration arm portions 10 and 11, a heavy metal film 21 for performing mass adjustment (frequency adjustment) on its own vibration state so as to vibrate within a range of a predetermined frequency, is coated. In addition, the heavy metal film 21 is divided into a rough regulation film 21a used for roughly regulating the frequency and a minute regulation film 21b used for minutely regulating the frequency. By performing the frequency regulation using the rough regulation film 21a and the minute regulation film 21b, it is possible to put the frequencies of the pair of vibration arm portions 10 and 11 within the range of a nominal (target) frequency of a device.

As shown in FIGS. 3 and 4, the piezoelectric vibrating reed 4 configured as above is bump-bonded to the upper surface of the base substrate 2 using a bump B such as gold. More specifically, the pair of mount electrodes 16 and 17 is bump-bonded on two bumps B, which are formed on lead-out electrodes 36 and 37 described later patterned on the upper surface of the base substrate 2, respectively, in the contact state. As a result, the piezoelectric vibrating reed 4 is supported in a state floating from the upper surface of the base substrate 2, and the mount electrodes 16 and 17 and the lead-out electrodes 36 and 37 are electrically connected to each other, respectively.

(Piezoelectric Vibrator)

As shown in FIGS. 1 to 4, the piezoelectric vibrator 1 of the present embodiment includes the package 9 in which the base substrate 2 and the lid substrate 3 are stacked in two layers.

As shown in FIGS. 1, 3, and 4, the lid substrate 3 is a transparent insulation substrate formed of a glass material, for example, soda lime glass, and is formed in the circular plate shape. Furthermore, on a bonding surface side to which the base substrate 2 is bonded, a rectangular concave portion 3a, into which the piezoelectric vibrating reed 4 enters, is formed. The concave portion 3a is a concave portion for the cavity becoming the cavity C which accommodates the piezoelectric vibrating reed 4 when both of the substrates 2 and 3 are overlapped with each other. Moreover, the lid substrate 3 is anode-bonded to the base substrate 2 in a state in which the concave portion 3a is opposed to the base substrate 2 side.

Similarly to the lid substrate 3, the base substrate 2 is a transparent insulation substrate formed of a glass material, for example, soda lime glass, and, as shown in FIGS. 1 to 4, is formed in the shape of a plate and large enough to be able to overlap with the lid substrate 3.

As shown in FIGS. 2 and 3, on the base substrate 2, a pair of through holes 30 and 31 passing through the base substrate 2 is formed. The pair of through holes 30 and 31 is formed in both end portions of a diagonal line of the cavity C. Moreover, in the pair of through holes 30 and 31, a pair of through electrodes 32 and 33, which is formed so as to bury the pair of through holes 30 and 31, is formed. The through electrodes 32 and 33 are formed of a conductive material such as Ag paste.

On the lower surface side of the base substrate 2, a pair of external electrodes 38 and 39, which is electrically connected to the pair of through electrodes 32 and 33, respectively, is formed.

As shown in FIGS. 2 and 4, on the upper surface (a bonding surface side to which the lid substrate 3 is bonded) of the base substrate 2, a bonding film 35 for the anode bonding and a pair of lead-out electrodes 36 and 37 are patterned by a conductive material (for example, aluminum). Among them, the bonding film 35 is formed along the periphery of the base substrate 2 so as to surround the periphery of the concave portion 3a formed on the lid substrate 3. Furthermore, the pair of lead-out electrodes 36 and 37 electrically connect one of the through electrodes, 32, of the pair of through electrodes 32 and 33, with one mount electrode 16 of the piezoelectric vibrating reed 4, and is patterned so as to electrically connect the other through electrode 33 with the other mount electrode 17 of the piezoelectric vibrating reed 4.

In operating the piezoelectric vibrator 1 configured as above, a predetermined driving voltage is applied to the external electrodes 38 and 39 formed on the base substrate 2. As a result, it is possible to apply the voltage to the excitation electrode 15 including the first excitation electrode 13 and the second excitation electrode 14 of the piezoelectric vibrating reed 4, which makes it possible to vibrate the pair of vibration arm portions 10 and 11 in the approaching and separating direction by a predetermined frequency. Moreover, it is possible to use the vibration of the pair of vibration arm portions 10 and 11 as a time source, a timing source of the control signal, a reference signal source or the like.

(Getter Material)

As shown in FIGS. 2 and 4, the piezoelectric vibrator 1 of the present embodiment includes the getter material (a second mass regulation film) 70 in the inner portion of the cavity. The getter material 70 is activated by laser irradiation and absorbs the surrounding gas, and can be formed of a metal, for example, aluminum (Al) or titanium (Ti), zirconium (Zr), chromium (Cr) or the like, an alloy thereof or the like. The getter material 70 of the present embodiment is formed on the upper surface of the base substrate 2 concurrently with the bonding film 35 and the lead-out electrodes 36 and 37 by the metal aluminum similar to the bonding film 35 and the lead-out electrodes 36 and 37. In addition, the getter material 70 is formed on the bottom surface of the cavity concave portion 3a of the lid substrate 3.

The getter material 70 is arranged in a position where laser is irradiated from the outside of the piezoelectric vibrator 1. In addition, since the bottom surface of the concave portion 3a in the lid substrate 3 is a non-polishing surface (frictional glass state), laser cannot be irradiated from the outside of the lid substrate 3 (from the upper surface side of the piezoelectric vibrator 1). For that reason, laser is irradiated from the outside of the base substrate 2 (from the lower surface side of the piezoelectric vibrator 1). Herein, the getter material 70 is arranged in a position where it is not overlapped with the external electrodes 38 and 39 when seen from the lower surface side of the piezoelectric vibrator 1. Furthermore, the getter material 70 is arranged in a position where it is not overlapped with the heavy metal film 21 when seen from the lower surface side of the piezoelectric vibrator 1 so that the getter material 70 does not disturb the laser irradiation to the heavy metal film 21. In the present embodiment, when seen from the lower surface side of the piezoelectric vibrator 1, at both outsides of the pair of vibration arm portions 10 and 11 in the width direction of the piezoelectric vibrating reed, the getter material 70 and 70 is arranged, respectively.

Figure 8A:
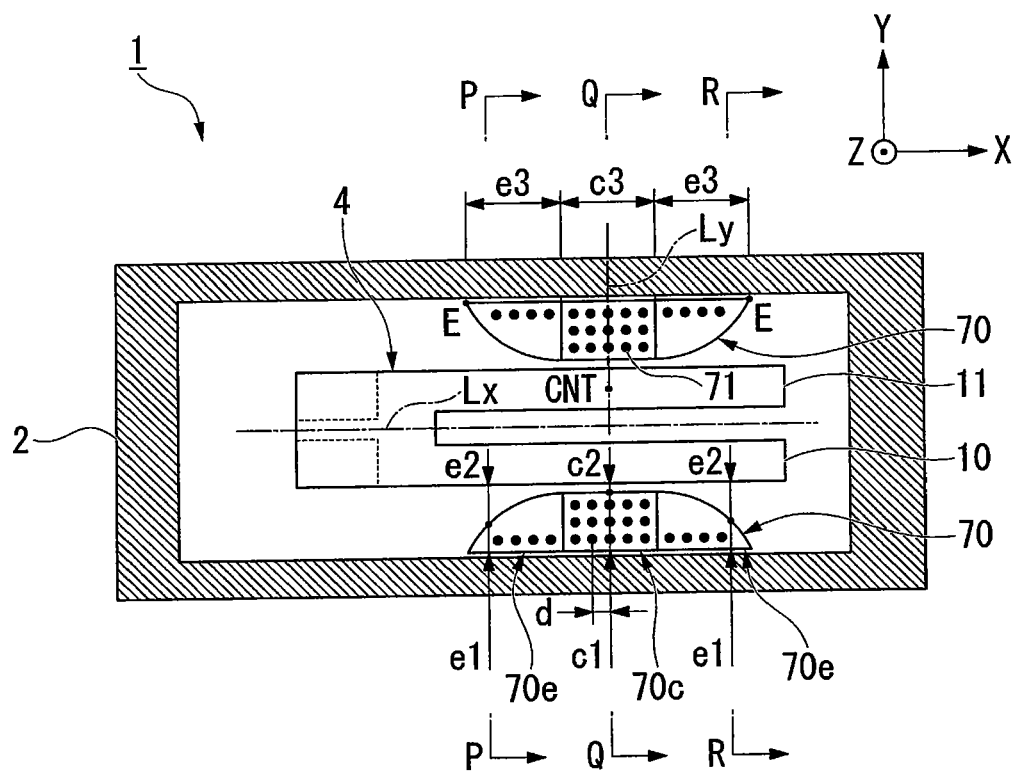
FIG. 8A is an explanatory diagram of the getter material of the first embodiment.

FIG. 8A is an explanatory diagram of the getter material in the present embodiment and is a plane view corresponding to FIG. 2. In addition, in FIG. 8A, in order to make it easier to see the drawing, the respective electrodes formed on the piezoelectric vibrating reed 4, the lead-out electrodes formed on the base substrate 2 or the like are omitted. In addition, in FIG. 8A, the longitudinal direction of the vibration arm portions 10 and 11 of the piezoelectric vibrating reed 4 is an X direction, a width direction of the piezoelectric vibrating reed 4 is a Y direction, and the thickness direction of the piezoelectric vibrating reed 4 is a Z direction.

As shown in FIG. 8A, the getter material 70 is formed along the X direction. An outer edge of the Y direction of the getter material 70 is formed in a straight line parallel to the X axis, and an inner edge of the Y direction of the getter material 70 is formed in a circular shape in which a center portion thereof in the X direction protrudes toward the vibration arm portion. The getter material 70 is formed in an axisymmetric shape relative to a center line Ly of the longitudinal direction of the vibration arm portions 10 and 11. Furthermore, the getter material 70 includes a middle portion 70c adjoining a center portion CNT of the longitudinal direction of the vibration arm portions 10 and 11, and end portions 70e and 70e arranged in ±X direction thereof. Furthermore, for example, a length c3 of the X direction of the middle portion 70c is the same as a length e3 of the X direction of the end portions 70e and 70e.

Figure 8B:
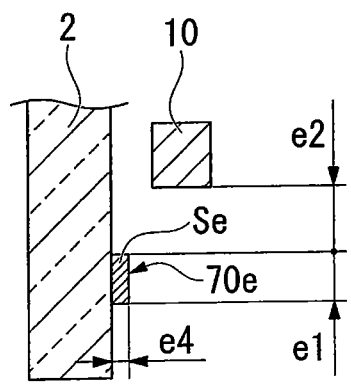
FIG. 8B is an explanatory diagram of the getter material of the first embodiment.
Figure 8C:
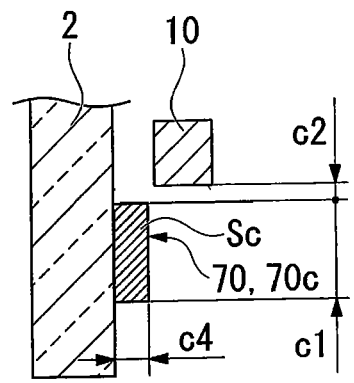
FIG. 8C is an explanatory diagram of the getter material of the first embodiment.
Figure 8D:
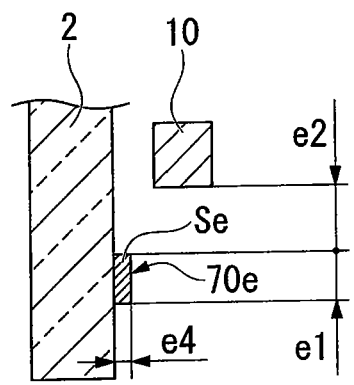
FIG. 8D is an explanatory diagram of the getter material of the first embodiment.

FIG. 8B is a cross-sectional view taken from line P-P of FIG. 8A. FIG. 8C is a cross-section view take from line Q-Q of FIG. 8A. FIG. 8D is a cross-sectional view taken from line R-R of FIG. 8A. A cross-sectional area Sc of the middle portion 70c of the getter material 70 shown in FIG. 8C is greater than a cross-sectional area Se of the end portion 70e shown in FIGS. 8B and 8D. Specifically, a width c1 of the middle portion 70c shown in FIG. 8C is greater than a width e1 of the end portion 70e shown in FIGS. 8B and 8D. Furthermore, it is desirable that a thickness c4 of the middle portion 70c shown in FIG. 8C is greater than a thickness e4 of the end portion 70e shown in FIGS. 8B and 8D.

Returning to FIG. 8A, the getter material 70 is arranged at a distance from the vibration arm portions 10 and 11 to the Y direction. The distance e2 from the vibration arm portion 10 to the end portion 70e of the getter material 70 is greater than the distance c2 from the vibration arm portion 10 to the middle portion 70c of the getter material 70.

When the getter material 70 is irradiated with laser, the getter material 70 is removed by evaporation and a laser irradiation trace 71 is formed on the surface of the getter material 70. For example, when one spot of the getter material 70 is irradiated with laser (spot irradiation), the laser irradiation trace 71 is formed in the shape of a bowl. Furthermore, when the spot irradiation is repeated at a short distance interval while scanning laser, the laser irradiation trace 71 is formed in the shape of a groove. In the present embodiment, the laser irradiation trace 71 in the getter material 70 and 70 of both sides of the piezoelectric vibrating reed 4 is formed so as to be axisymmetric to a center line Lx of the piezoelectric vibrating reed 4. Furthermore, the laser irradiation trace 71 in each getter material 70 is formed so as to be axisymmetric to a center line Ly of the longitudinal direction of the vibration arm portions 10 and 11. Furthermore, the laser irradiation trace 71 in the end portion 70e of the getter material 70 is formed on the outside (that is, a side away from the vibration arm portions 10 and 11) from the center of the width direction of the middle portion 70c.

FIRST MODIFIED EXAMPLE

Figure 9A:
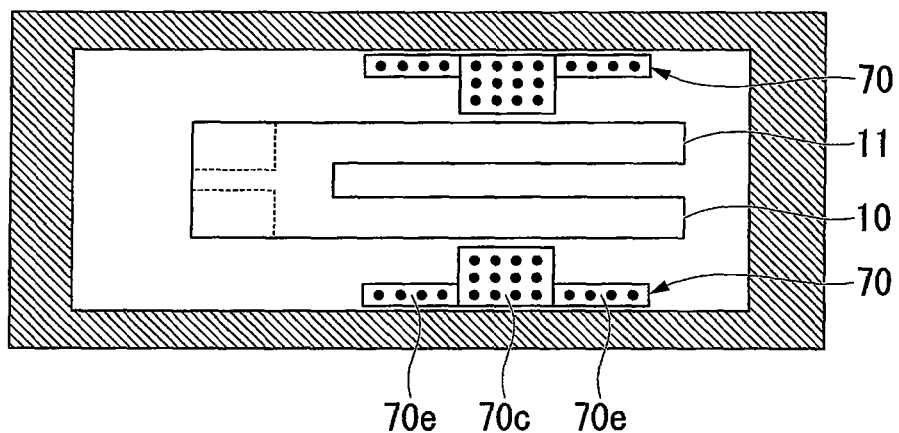
FIG. 9A is an explanatory diagram of the getter material of a first modified example of the first embodiment.

FIG. 9A is an explanatory diagram of a getter material in a first modified example of the first embodiment and is a plane view corresponding to FIG. 2. In the first modified embodiment shown in FIGS. 8A to 8D, the inner edge of the Y direction of the getter material 70 is formed in the shape of a circular shape, but the first modified example shown in FIG. 9A differs in that the inner edge portion is formed in the shape of steps.

In the first modified example, the inner edge of the Y direction of the getter material 70 is formed in a straight line parallel to the vibration arm portions 10 and 11. Moreover, similarly to the first embodiment, the distance from the vibration arm portions 10 and 11 to the end portions 70e and 70e of the getter material 70 is greater than that from the vibration arm portions 10 and 11 to the middle portion 70c of the getter material 70. As a result, the inner edge of the Y direction of the getter material 70 is formed in the shape of steps.

SECOND MODIFIED EXAMPLE

Figure 9B:
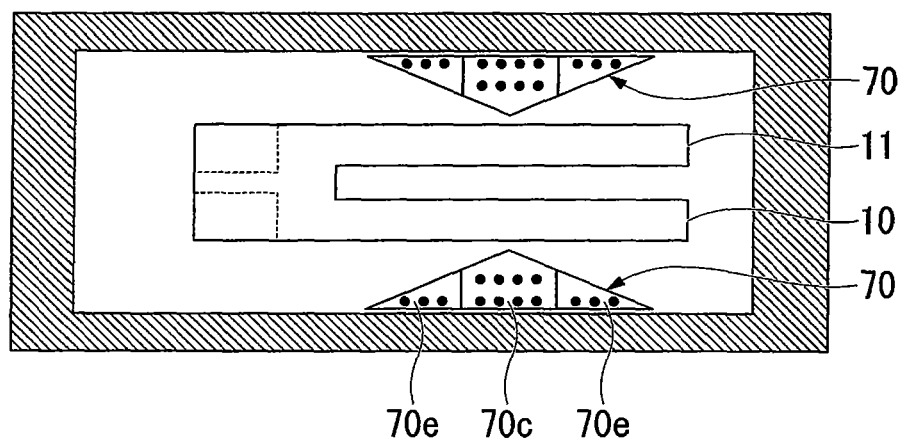
FIG. 9B is an explanatory diagram of the getter material of a second modified example of the first embodiment.

FIG. 9B is an explanatory diagram of a getter material in a second modified example of the first embodiment and is a plane view corresponding to FIG. 2. The second modified embodiment shown in FIG. 9A is different from the first embodiment in that an inner edge of the Y direction of the getter material 70 is in the shape of a mound.

In the second modified example, the inner edge of the Y direction of the getter material 70 is formed in a straight line connecting the center portion of the X direction with both end portions. Furthermore, similarly to the first embodiment, the distance from the vibration arm portions 10 and 11 to the end portions 70e and 70e of the getter material is greater than that from the vibration arm portions 10 and 11 to the middle portion 70c of the getter material. As a result, the inner edge of the Y direction of the getter material 70 is formed in the shape of a mound.

(Method of Manufacturing Piezoelectric Vibrator)

Figure 10:
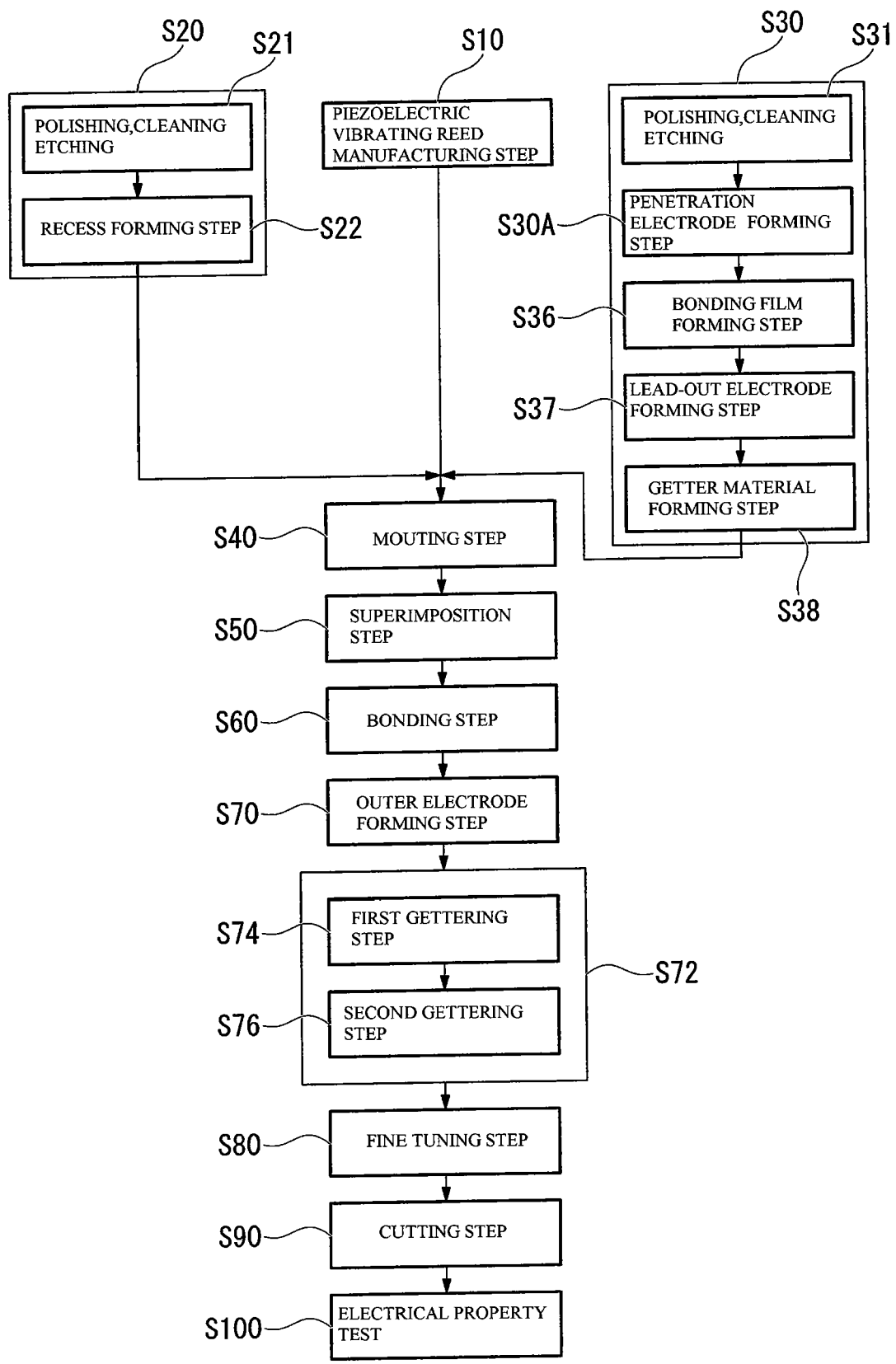
FIG. 10 is a flow chart of a method of manufacturing the piezoelectric vibrator.
Figure 11:
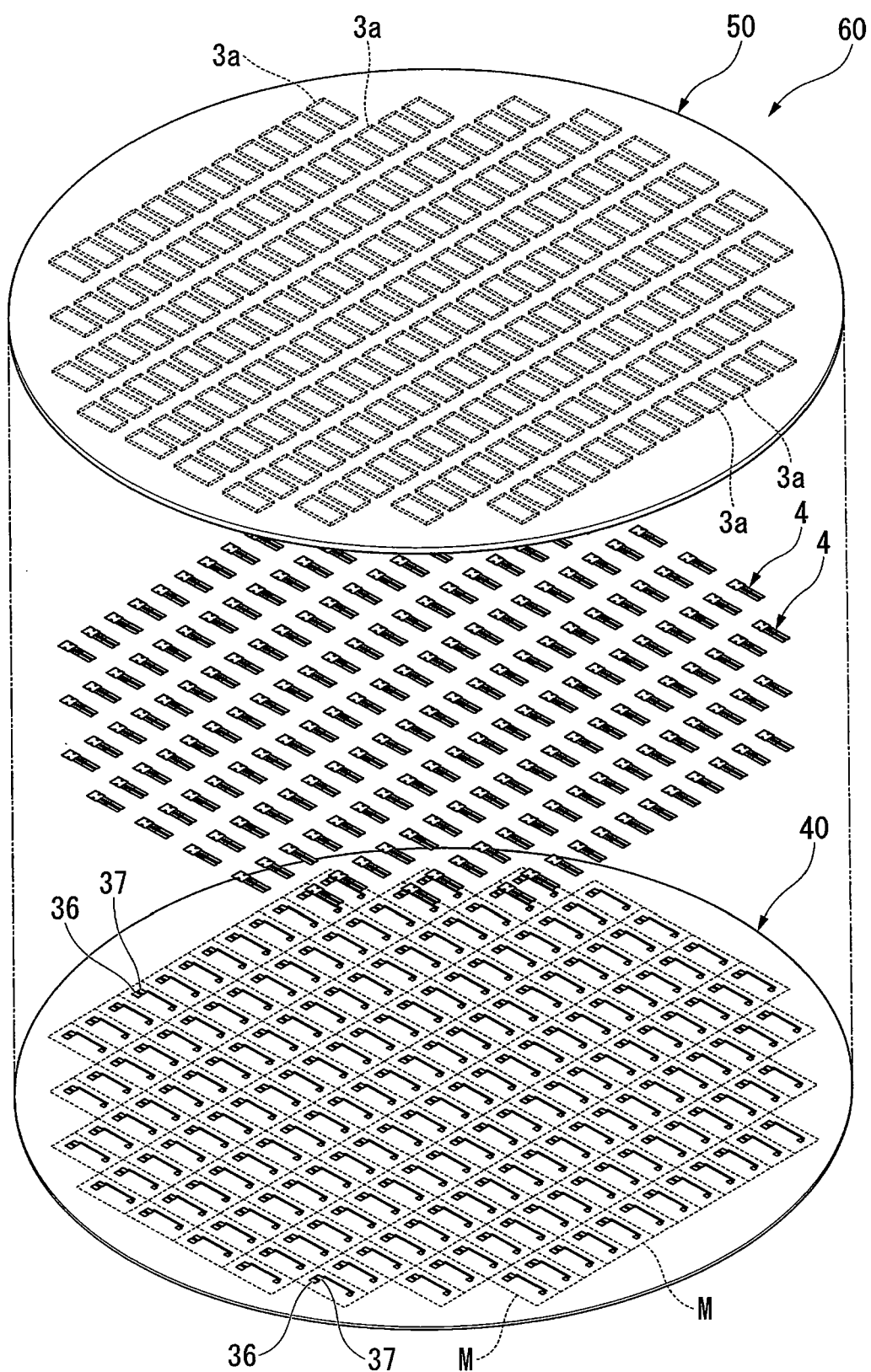
FIG. 11 is an exploded perspective view of a wafer body in which a base substrate wafer and a lid substrate wafer are anode-bonded to each other in a state in which the piezoelectric vibrating reed is accommodated in the cavity.

FIG. 10 is a flow chart of a method of manufacturing a piezoelectric vibrator. FIG. 11 is an explanatory diagram of the method of manufacturing the piezoelectric vibrator. In addition, in FIG. 11, to make the drawing easier to see, the bonding film 35 and the getter material 70 in the base substrate wafer 40 are omitted. In addition, dash lines M shown in FIG. 11 show cutting lines to be cut in a cutting process performed later. In the present embodiment, a plurality of piezoelectric vibrating reeds 4 are arranged between the base substrate wafer 40 and the lid substrate wafer 50 to produce a plurality of piezoelectric vibrators at a time.

Firstly, a piezoelectric vibrating reed production process is performed to produce the piezoelectric vibrating reed 4 shown in FIGS. 5 to 7 (S10). Furthermore, after producing the piezoelectric vibrating reed 4, the rough regulation of the resonance frequency is performed. This is performed by irradiating the rough regulation film 21a of the heavy metal film 21 with laser beam to evaporate a part thereof, thereby changing the weight thereof. In addition, minute regulation, which further accurately regulates the resonance frequency, is performed after the mount. This will be described later.

Next, as shown in FIG. 11, a first wafer producing process, in which the lid substrate wafer 50 becoming the lid substrate later is produced up to a state immediately before an anode bonding is to be performed, is performed (S20). Firstly, after the soda lime glass is polished up to a predetermined thickness and is cleaned, a circular plate shaped lid substrate wafer 50, in which the deformed layer of the uppermost surface is removed by etching or the like, is formed (S21). Next, a concave portion forming process, in which a plurality of concave portions 3a for the cavity are formed on the bonding surface of the lid substrate wafer 50 in a column and row direction by etching or the like, is performed (S22). At this point in time, the first wafer producing process is finished.

Next, at the timing simultaneously with or immediately before and after the process, as a second wafer producing process, in which the base substrate wafer 40 that later becomes the base substrate is produced up to the state immediately before an anode bonding is to be performed, is performed (S30). Firstly, after the soda lime glass is polished up to a predetermined thickness and is cleaned, a circular plate-shaped base substrate wafer 40, in which a deformed layer of the uppermost surface is removed by etching or the like, is formed (S31). Next, a through electrode forming process, which forms a plurality of pairs of through electrodes 32 and 33 in the base substrate wafer 40, is performed (S30A).

Next, as shown in FIG. 4, a bonding film forming process (S36) of patterning a conductive material on the upper surface of the base substrate wafer 40 to form the bonding film 35, a lead-out electrode forming process (S37) of forming the lead-out electrodes 36 and 37, and a getter material forming process (S38) of forming the getter material 70 are concurrently performed. In addition, the bonding film forming process (S36), the lead-out electrode forming process (S37), and the getter material forming process (S38) may be performed in an arbitrary process sequence by performing all or a part thereof as a separate process.

Next, a mounting process, in which a plurality of produced piezoelectric vibrating reeds 4 are bonded to the upper surface of the base substrate wafer 40 via the pair of lead-out electrodes 36 and 37, respectively, is performed (S40). First, the bump B made of gold and the like is formed on each of the pair of lead-out electrodes 36 and 37. Moreover, after the base portion 12 of the piezoelectric vibrating reed 4 is mounted on the bump B, the piezoelectric vibrating reed 4 is pressed to the bump B while heating the bump B at a predetermined temperature. As a result, the piezoelectric vibrating reed 4 is mechanically supported on the bump B, and the mount electrodes 16 and 17 and the lead-out electrodes 36 and 37 are electrically connected to each other in the state of floating from the upper surface of the base substrate wafer 40.

After the mounting of the piezoelectric vibrating reed 4 is finished, as shown in FIG. 11, an overlapping process, in which the lid substrate wafer 50 is overlapped with the base substrate wafer 40, is performed (S50). Specifically, both wafers 40 and 50 are aligned in the correct position while setting a standard mark (not shown) or the like as an index. As a result, the piezoelectric vibrating reed 4 is accommodated within the cavity formed between both wafers 40 and 50.

After the overlapping process, a bonding process, in which the two overlapped wafers 40 and 50 are put in an anode bonding device (not shown) and a predetermined voltage is applied at a predetermined temperature environment to perform the anode bonding, is performed (S60). Specifically, a predetermined voltage is applied between the bonding film 35 shown in FIG. 4 and the lid substrate wafer 50. Then, an electrochemical reaction occurs on an interface between the bonding film 35 and the lid substrate wafer 50, and both are strongly bonded to each other, respectively, and are subjected to the anode bonding. As a result, the piezoelectric vibrating reed 4 can be sealed within the cavity C, and it is possible to obtain a wafer body 60 in which the base substrate wafer 40 and the lid substrate wafer 50 are bonded to each other.

Moreover, after the above-mentioned anode bonding process is finished, an external electrode forming process, in which an conductive material is patterned on the lower surface of the base substrate wafer 40, and a plurality of pairs of external electrodes 38 and 39 are formed, is performed (S70). By this process, it is possible to operate the piezoelectric vibrating reed 4 sealed in the cavity C from the external electrodes 38 and 39 via the through electrodes 32 and 33.

(Gettering Process)

Next, a gettering process of irradiating the getter material 70 shown in FIG. 4 with laser to activate the getter material 70 is performed (S72). As laser, the same YAG laser or the like used for a minute regulation process mentioned later can be adopted. As mentioned above, since laser cannot be irradiated from the outside of the lid substrate wafer 50, the laser irradiation from the outside of the base substrate wafer 40 is performed. When the getter material 70 (e.g., Al) is evaporated by the laser irradiation, oxygen from the cavity is absorbed to create metal oxides (e.g., $Al_2O_3$). As a result, the oxygen in the cavity is consumed, which can improve the degree of vacuum over a certain level. Herein, the term "certain level" refers to a state in which the series resonance resistance value does not greatly fluctuate even if the degree of vacuum is improved more than that level. As a result, a suitable series resonance resistance value can be secured.

Incidentally, when the gettering is performed in the vicinity of the vibration arm portions 10 and 11 of the piezoelectric vibrating reed 4, the byproducts of gettering are attached to the vibration arm portions 10 and 11. In the case of gettering near the front end portion of the vibration arm portions 10 and 11, the products are mainly attached to the front end portions of the vibration arm portions 10 and 11. In this case, since the weight (corresponding to the mass of the spring-mass system) of the front end portion increases, the frequency of the piezoelectric vibrating reed 4 declines. The phenomenon is opposite to the minute regulation process described later (a process of trimming the minute regulation film 21b of the front end portions of the vibration arm portions 10 and 11 by the laser irradiation and reducing the weight of the front end portion to increase the frequency). On the other hand, in a case where the gettering is performed in the vicinity of the proximal end portions of the vibration arm portions 10 and 11, the product is mainly attached to the proximal end portions of the vibration arm portions 10 and 11. In this case, an increase in rigidity (corresponding to the spring constant of the spring-mass system) of the vibration arm portions 10 and 11 is dominant, and the frequency of the piezoelectric vibrating reed 4 increases.

In addition, even when the frequency of the piezoelectric vibrating reed 4 fluctuates in the gettering process, minute regulation of the frequency of the piezoelectric vibrator is possible by the minute regulation process describe later. However, if the frequency of the piezoelectric vibrating reed 4 greatly fluctuates due to the gettering process, it is difficult or impossible to limit the frequency of the piezoelectric vibrator within the range of the nominal frequency in the minute regulation.

Herein, in the present embodiment, firstly, a first gettering process of activating the middle portion 70c of the getter material 70 adjoining the center portion of the vibration arm portions 10 and 11 shown in FIGS. 8A to 8D is performed (S74). Specifically, the middle portion 70c of the getter material 70 is irradiated with laser.

In the present embodiment, the cross-sectional area Sc of the middle portion 70c of the getter material 70 is greater than the cross-sectional area Se of the end portion 70e. For that reason, only by irradiating the middle portion 70c with laser, a great quantity of getter material 70 can be evaporated, whereby the degree of vacuum in the package can be secured. In addition, by irradiating the middle portion 70c with laser, the product is mainly attached to the center portion of the vibration arm portions 10 and 11. Thus, any fluctuations in frequency of the piezoelectric vibrating reed due to the gettering can be suppressed.

In the middle portion 70c of the getter material 70, firstly, the laser irradiation is performed along the center line Ly. Next, the laser irradiation is performed along the straight line in which the center line Ly is offset in ±X direction by a distance d. Similarly, the laser irradiation is sequentially performed along the straight line in which the center line Ly is offset in ±X direction by a distance n·d (n is a natural number), and, when an inner portion of the cavity reaches a predetermined degree of vacuum, the laser irradiation is stopped. In this manner, by expanding the laser irradiation range from the center of the X direction toward the outside, the product can be attached to the portion as near the center portion of the vibration arm portions 10 and 11 as possible. Thus, it is possible to suppress any fluctuations in frequency of the piezoelectric vibrating reed due to the gettering to a minimum level.

Even when all of the middle portion 70c of the getter material 70 is gettered in the above-mentioned first gettering process, when the inner portion of the cavity does not reach a predetermined degree of vacuum, a second gettering process of irradiating the end portion 70e of the getter material 70 with laser to activate the same is performed (S76). In the second gettering process, since the gettering is performed near the front end portions or the proximal end portions of the vibration arm portions 10 and 11, the product is attached to the front end portions or the proximal end portions of the vibration arm portions 10 and 11, whereby the frequency of the piezoelectric vibrating reed may fluctuate. However, since the end portion 70e is subjected to the second gettering process after performing the first gettering of the middle portion 70c, it is possible to suppress any fluctuations in frequency of the piezoelectric vibrating reed due to the gettering to a minimum level.

In the second gettering process, the laser irradiation range is expanded from the middle side of the X direction toward the outside, and the laser irradiation is performed so as to be axisymmetric to the center line Ly. Specifically, firstly, the laser irradiation is performed along the straight line in which the center line Ly is offset in ±X direction by a distance c3/2. Next, the laser irradiation is performed along the straight line in which the center line Ly is offset in ±X direction by a distance c3/2+d. Similarly, the laser irradiation is sequentially performed along the straight line in which the center line Ly is offset in ±X direction by a distance c3/2+n·d (n is a natural number), and when an inner portion of the cavity reaches a predetermined degree of vacuum, the laser irradiation is stopped. In addition, since the laser irradiation is performed so as to be axisymmetric to the center line Ly, the laser irradiation trace 71 is formed so as to be axisymmetric to the center line Ly.

In this manner, in the second gettering process, by expanding the laser irradiation range from the middle side of the X direction to the outside thereof, the product can be attached to the portion as near the center portion of the vibration arm portions 10 and 11 as possible. In addition, by performing the gettering so as to be axisymmetric to the center line Ly, the product due to the gettering can equally be attached to the front end portion and the proximal end portion of the vibration arm portion. As a result, any increases or decreases in frequency can be offset. Thus, any fluctuations in frequency of the piezoelectric vibrating reed due to the gettering can be suppressed to a minimum level.

Furthermore, in the present embodiment, since the distance from the vibration arm portions 10 and 11 to the end portion 70e of the getter material 70 is greater than the distance from the vibration arm portions 10 and 11 to the middle portion 70c of the getter material 70, the gettering of the end portion 70e of the getter material 70 can be performed in a position separated from the vibration arm portions 10 and 11. As a result, it is possible to suppress the product from being attached to the front end portions or the proximal end portions of the vibration arm portions 10 and 11, which can suppress any fluctuations in frequency of the piezoelectric vibrating reed due to the gettering.

Returning to the flow chart of FIG. 10, after the gettering process (S72), a minute regulation process, in which the frequency of the respective piezoelectric vibrators 1 sealed in the cavity C is minutely adjusted so as to be put within a predetermined range, is performed (S80). To explain specifically, the voltage is applied to the pair of external electrodes 38 and 39 formed on the lower surface of the base substrate wafer 40 to vibrate the voltage vibrating reed 4. Moreover, laser is irradiated from the outside of the base substrate wafer 40 while measuring the frequency to evaporate and trim the minute regulation film 21b of the heavy metal film 21. When the minute regulation film 21b is trimmed, since the weights of the front end sides of the pair of vibration arm portions 10 and 11 decrease, the frequency of the piezoelectric vibrating reed 4 increases. As a result, it is possible to minutely regulate the frequency of the piezoelectric vibrator 1 so as to be limited within a predetermined range of the nominal frequency.

After the minute regulation process of the frequency is finished, a cutting process, in which a wafer body 60 shown in FIG. 11 is cut along the cutting lines M to form small pieces, is performed (S90). As a result, it is possible to manufacture a plurality of surface mount type piezoelectric vibrators 1 having a two layer structure shown in FIG. 1 in which the piezoelectric vibrating reed 4 is sealed in the cavity C formed between the base substrate 2 and the lid substrate 3 that are anode-bonded to each other shown, at a time.

In addition, after the cutting process (S90) is performed to form the small pieces to the respective piezoelectric vibrators 1, the gettering process (S72) and the minute regulation process (S80) may be sequentially performed. However, as described above, by performing the gettering process (S72) and the minute regulation process (S80) in advance, the gettering and the minute regulation can be performed in the state of the wafer body 60, which makes it possible to more effectively manufacture the plurality of piezoelectric vibrators 1. Accordingly, it is desirable in that an improvement in throughput can be promoted.

After that, an electrical property inspection of the piezoelectric vibrating reed 4 is performed (S100). That is, the resonant frequency, the resonant resistance value, the drive level property (an excitation electric power dependence of the resonant frequency and the resonant resistance value) or the like of the piezoelectric vibrating reed 4 are measured and checked. Furthermore, the insulation resistance property or the like is jointly checked. Moreover, the exterior inspection of the piezoelectric vibrator 1 is performed at the end, and the size, the quality or the like are finally checked. As a result, the manufacturing of the piezoelectric vibrator 1 is finished.

As mentioned above, the piezoelectric vibrator according to the present embodiment shown in FIG. 8A to 8D is configured so that the cross-sectional area Sc of the middle portion 70c of the getter material 70 adjoining the center portion CNT of the longitudinal direction of the vibration arm portions 10 and 11 is greater than the cross-sectional area Se of the end portions 70e and 70e of the getter material 70.

According to the configuration, only by gettering the middle portion 70c, a great quantity of getter material can be activated, and the degree of vacuum in the package 9 can be secured. In addition, only by gettering the middle portion 70c, the product due to the gettering is mainly attached to the center portion of the vibration arm portions 10 and 11. Thus, it is possible to suppress any fluctuations in frequency of the piezoelectric vibrating reed due to the gettering.

Furthermore, the method of manufacturing the piezoelectric vibrator according to the present embodiment is configured to have the first gettering process of activating the middle portion 70c of the getter material 70 adjoining the center portion CNT of the longitudinal direction of the vibration arm portions 10 and 11, and the second gettering process of activating the end portions 70e and 70e of the getter material 70 adjoining the front end portions or the proximal end portions of the longitudinal direction of the vibration arm portions 10 and 11.

According to the configuration, since the first gettering process of activating the middle portion 70c is performed in advance, it is possible to attach the product due to the gettering as close to the center portion of the vibration arm portions 10 and 11 as possible. Thus, any fluctuations in frequency of the piezoelectric vibrating reed due to the gettering can be suppressed.

In this manner, since any fluctuations in frequency of the piezoelectric vibrating reed can be suppressed in the gettering process, the frequency of the piezoelectric vibrator can be limited within the range of the nominal frequency in the next minute regulation process. Thus, the throughput of the piezoelectric vibrator can be improved.

(Second Embodiment)

Figure 12:
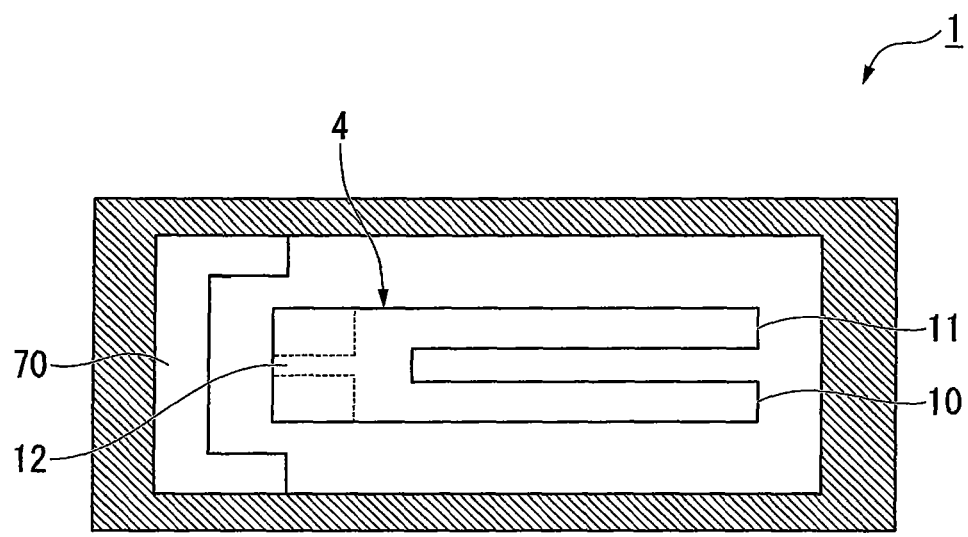
FIG. 12 is an explanatory diagram of the getter material of a second embodiment.

FIG. 12 is an explanatory diagram of the piezoelectric vibrator according to a second embodiment and is a plan view corresponding to FIG. 2. In the first embodiment shown in FIG. 8A, the getter material 70 is formed outside the vibration arm portions 10 and 11 of the piezoelectric vibrating reed 4. However, the second embodiment shown in FIG. 12 differs in that the getter material 70 is formed around the base portion 12 of the piezoelectric vibrating reed 4. In addition, detailed explanation of the same configuration as the first embodiment will be omitted.

In the second embodiment, the getter material 70 is formed around the base portion 12 of the piezoelectric vibrating reed 4. Upon gettering the getter material 70, the product is attached to the base portion 12 and is not attached to the vibration arm portions 10 and 11. For that reason, any fluctuations in frequency of the piezoelectric vibrating reed 4 due to the gettering can be suppressed. As a result, the frequency of the piezoelectric vibrator can be limited within the range of the nominal frequency in the next minute regulation process. Thus, the throughput of the piezoelectric vibrator can be improved.

(Oscillator)

Next, an embodiment of an oscillator of the invention will be described with reference to FIG. 13.

Figure 13:
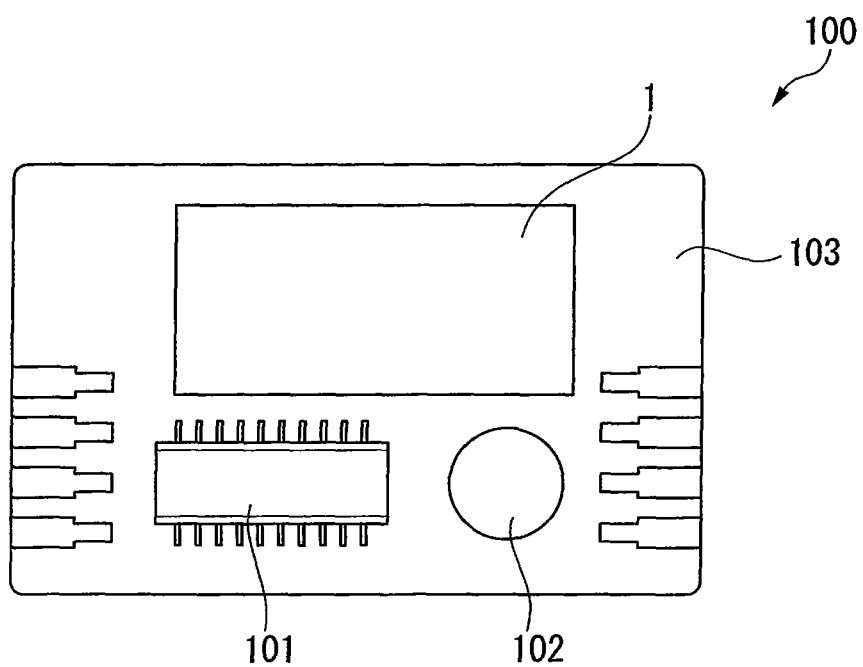
FIG. 13 is a schematic configuration diagram of an oscillator.

As shown in FIG. 13, an oscillator 100 of the present embodiment is constituted as an oscillating element in which the piezoelectric vibrator 1 is electrically connected to an integrated circuit 101. The oscillator 100 includes a substrate 103 on which an electronic component 102 such as a condenser is mounted. The integrated circuit 101 for the oscillator is mounted on the substrate 103, and the piezoelectric vibrator 1 is mounted in the vicinity of the integrated circuit 101. The electronic component 102, the integrated circuit 101 and the piezoelectric vibrator 1 are electrically connected to each other by a wiring pattern (not shown), respectively. In addition, the respective constituents are molded by resin (not shown).

In the oscillator 100 configured as above, when the voltage is applied to the piezoelectric vibrator 1, the piezoelectric vibrating reed 4 in the piezoelectric vibrator 1 is vibrated. The vibration is converted to an electric signal by the piezoelectric property of the piezoelectric vibrating reed 4 and input in the integrated circuit 101 as the electric signal. The input electric signal is subjected to the respective processing by the integrated circuit 101 and is output as the frequency signal. As a result, the piezoelectric vibrator 1 functions as the oscillating element.

Furthermore, in the configuration of the integrated circuit 101, by selectively setting an RTC (Real Time Clock) module or the like, for example, depending on the demand, the function of controlling the operating date or time of the equipment or external equipment, in addition to the timepiece single function oscillator or the like, or providing the time or the calendar or the like can be added.

Moreover, in the present embodiment, since the piezoelectric vibrator 1 having an improved throughput is included, the cost of the oscillator 100 can be reduced.

(Electronic Equipment)

Figure 14:
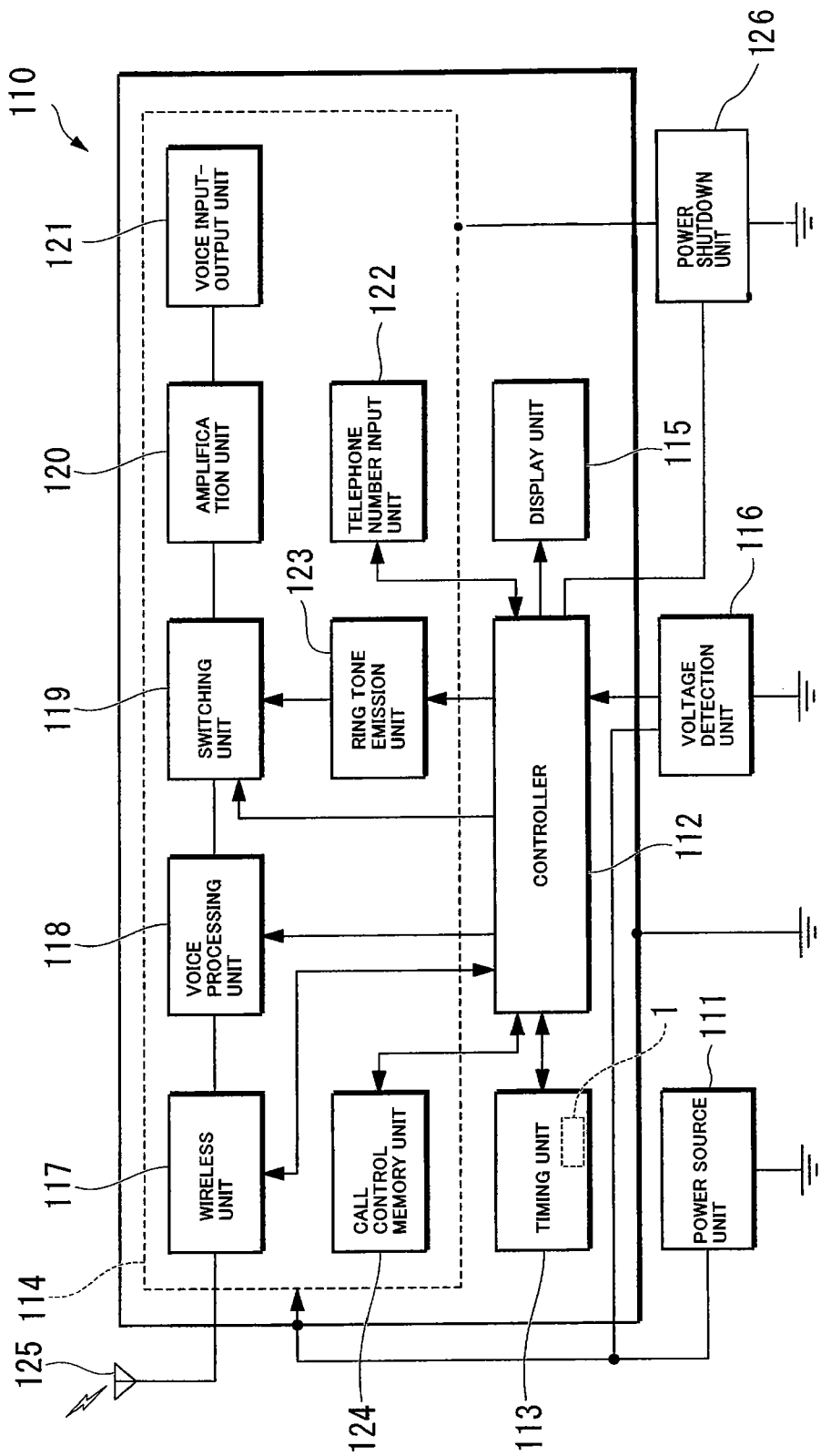
FIG. 14 is a block diagram of electronic equipment.

Next, an embodiment of the electronic equipment according to the invention will be explained with reference to FIG. 14. Furthermore, as the electronic equipment, portable information equipment 110 having the above-mentioned piezoelectric vibrator 1 will be explained as an example. Firstly, the portable information equipment 110 of the present embodiment is represented by, for example, a mobile phone, and is one in which a wrist watch in the related art is developed and improved. The exterior thereof is similar to the wrist watch, where a liquid crystal display is arranged on a portion equivalent to the hour plate, and the present time or the like can be displayed on the screen. Furthermore, when it is used as a communicator, it can be separated from the wrist and can perform the same communication as the mobile phone of the related art by a speaker and a microphone built in an inner portion of the band. However, as compared to the mobile phone of the related art, it is radically miniaturized and lightened.

Next, the configuration of the portable information equipment 110 of the present embodiment will be explained. As shown in FIG. 14, the portable information equipment 110 includes the piezoelectric vibrator 1 and a power source portion 111 for supplying the electric power. The power source portion 111 includes, for example, a lithium secondary battery. A control portion 112 which performs various controls, a measurement portion 113 performing the count of the time or the like, a communication portion 114 performing the communication with the outside, a display portion 115 displaying various information, and a voltage detection portion 116 detecting the voltage of the respective functional portions are connected to the power source portion 111 in parallel. Moreover, the respective functional portions are provided with the electric power by the power source portion 111.

The control portion 112 controls the respective functional portions to perform the motion control of the whole system such as the transmission and the reception of the sound data, or the measurement or the display of the current time. Furthermore, the control portion 112 includes a ROM with a program written thereon in advance, a CPU that reads and executes the program written on the ROM, and a RAM or the like used as a work area of the CPU.

The measurement portion 113 includes an integrated circuit, which is equipped with an oscillation circuit, register circuit a counter circuit, interface circuit or the like, and the piezoelectric vibrator 1. When the voltage is applied to the piezoelectric vibrator 1, the piezoelectric vibrating reed 4 is vibrated and the vibration is converted to the electric signal by the piezoelectric property of crystal, and is input to the oscillation circuit as the electric signal. The output of the oscillation circuit is binarized and is counted by the resister circuit and the counter circuit. Moreover, the signal is transmitted to and received from the control portion 112 via the interface circuit, and the current time, the current date, the calendar information or the like is displayed on the display portion 115.

The communication portion 114 has the same function as the mobile phone of the related art, and includes a wireless portion 117, a sound processing portion 118, a switch-over portion 119, an amplification portion 120, a sound input and output portion 121, a phone number input portion 122, a receiving sound generation portion 123, and a call control memory portion 124.

The wireless portion 117 performs the exchange of the transmission and the reception of various data such as sound data with a base station via an antenna 125. The sound processing portion 118 encodes and decrypts the sound signal input from the wireless portion 117 or the amplification portion 120. The amplification portion 120 amplifies the signal, which is input from the sound processing portion 118 or the sound input and output portion 121, to a predetermined level. The sound input and output portion 121 includes a speaker, a microphone or the like, amplifies the receiving sound or the receipt sound, or collect the sound.

Furthermore, the receiving sound generation portion 123 creates the receiving sound according to calls from the base station. The switch-over portion 119 switches the amplification portion 120 connected to the sound processing portion 118 to the receiving sound generation portion 123 only when receiving, whereby the receiving sound created in the receiving sound generation portion 123 is output to the sound input and output portion 121 via the amplification portion 120.

In addition, the call control memory portion 124 stores the program relating to the departure and the arrival of the communication. Furthermore, the phone number input portion 122 includes, for example, number keys from 0 to 9 and other keys, and by pushing the number keys or the like, the phone number of the call destination or the like is input.

The voltage detection portion 116 detects the voltage drop and notifies it to the control portion 112 when the voltage added to the respective function portions such as the control portion 112 by the power source portion 111 is lower than a predetermined value. The predetermined voltage value of this time is a value which is preset as a minimum voltage necessary for stably operating the communication portion 114, and, for example, is about 3V. The control portion 112 receiving notification of a voltage drop from the voltage detection portion 116 prohibits the operation of the wireless portion 117, the sound processing portion 118, the switch-over portion 119 and the receiving sound generation portion 123. Particularly, stopping the operation of the wireless portion 117 having a high rate of electric power consumption is essential. Furthermore, the intent that the communication portion 114 becomes unusable due to the lack of the battery residual quantity is displayed on the display portion 115.

That is, the operation of the communication portion 114 can be prohibited by the voltage detection portion 116 and the control portion 112 and the intent can be displayed on the display portion 115. The display may be a text message, but as a more intuitive display, an X (cross) display may be made on a phone icon displayed on the upper portion of the display surface of the display portion 115.

In addition, the power source shut-off portion 126 which can selectively shut off the power source of the portion relating to the function of the communication portion 114 is included, whereby the function of the communication portion 114 can further reliably be stopped.

Moreover, in the present embodiment, since the piezoelectric vibrator 1 having an improved throughput is included, the cost of the portable information equipment 110 can be reduced.

(Radio-Controlled Timepiece)

Next, an embodiment of a radio-controlled timepiece according to the invention will be explained with reference to FIG. 15.

Figure 15:
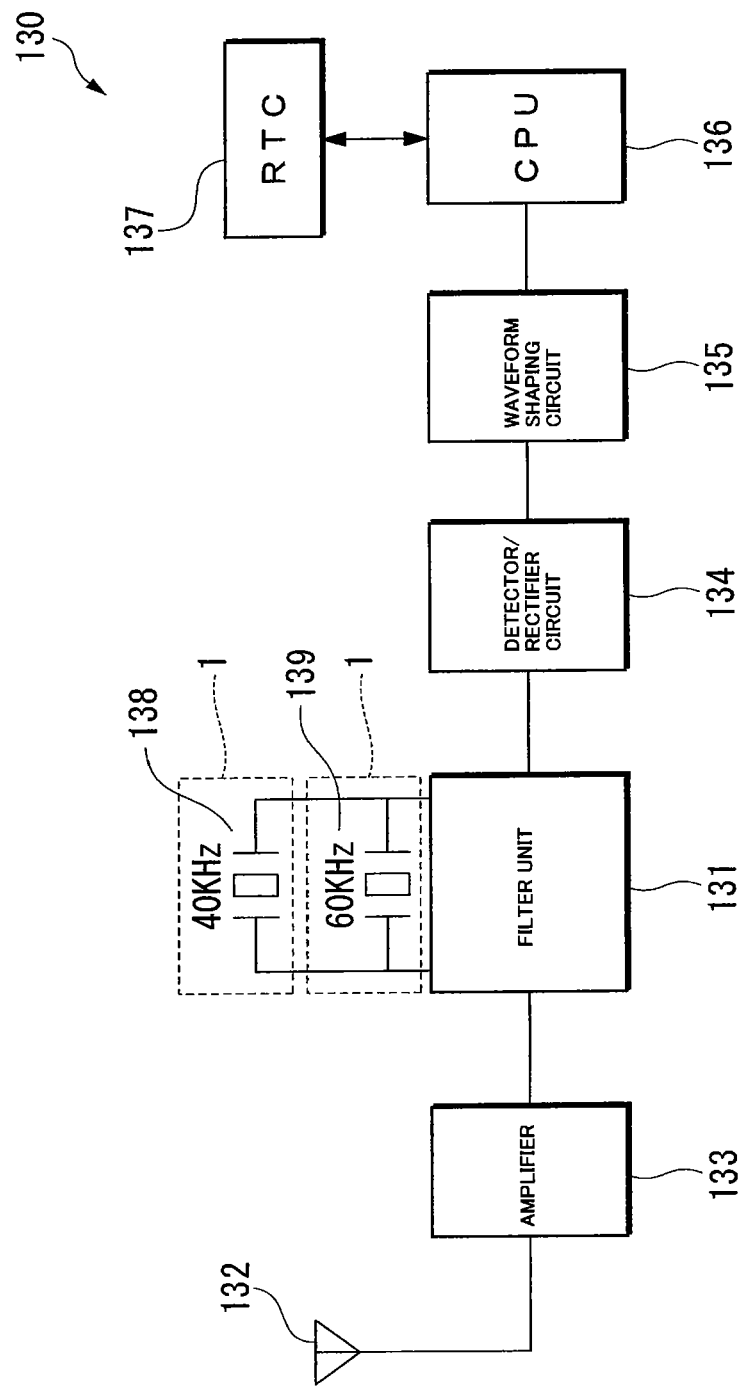
FIG. 15 is a block diagram of a radio-controlled timepiece.
Figure 16:
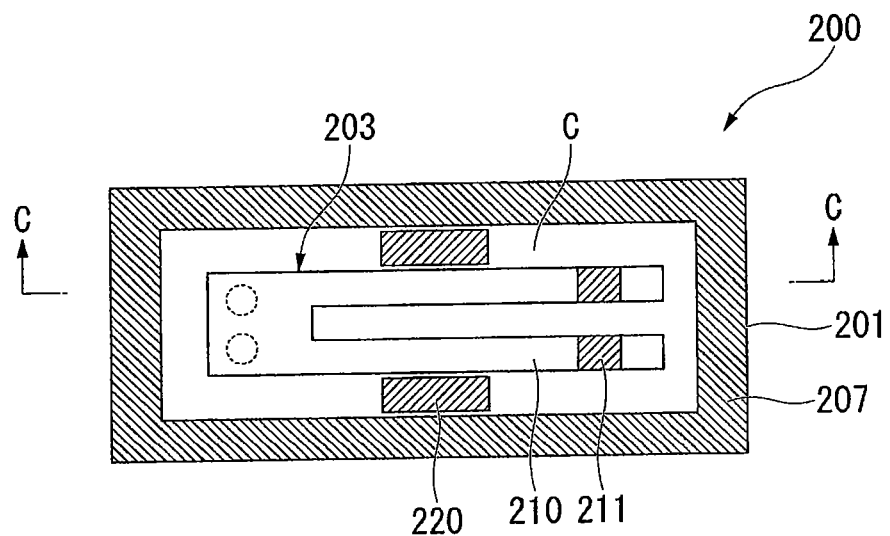
FIG. 16 is a plane view of a state in which the lid substrate of the piezoelectric vibrator of the related art is removed.
Figure 17:
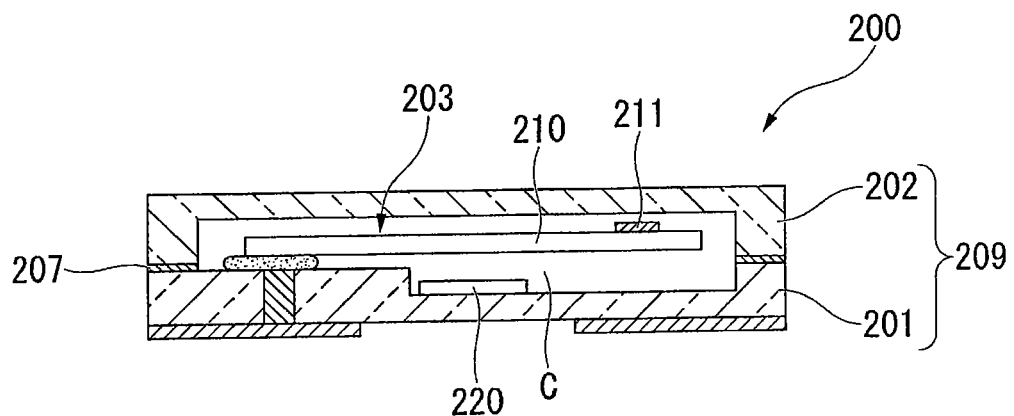
FIG. 17 is a cross-sectional view taken along line C-C of FIG. 16.

As shown in FIG. 15, a radio-controlled timepiece 130 of the present embodiment is a timepiece which includes the piezoelectric vibrator 1 that is electrically connected to a filter portion 131 and includes the function of receiving standard radio waves including the timepiece information and automatically correcting and displaying the same as the correct time.

In Japan, transmitting stations for transmitting standard radio waves exist in Fukushima prefecture (40 KHz) and Saga prefecture (60 KHz), and each transmits the standard radio waves, respectively. Since long waves such as 40 KHz or 60 KHz have a property of spreading across the surface of the earth and a property of spreading while reflecting between the ionization layer and the ground of the earth, the spreading range is wide, and the above-mentioned two transmitting stations cover the whole of Japan.

Hereinafter, a functional configuration of the radio-controlled timepiece 130 will be explained in detail.

An antenna 132 receives the standard radio waves of the long waves at 40 KHz or 60 KHz. The standard radio waves of the long waves apply an AM modulation to the transport waves of 40 KHz or 60 KHz in a time information called a time code. The standard radio waves of the received long waves are amplified by an amp 133 and are filtered and tuned by a filter portion 131 having a plurality of piezoelectric vibrators 1.

The piezoelectric vibrator 1 of the present embodiment includes crystal vibrator portions 138 and 139 having the same resonant frequencies of 40 KHz and 60 KHz as the transport frequency, respectively.

In addition, the signal of the filtered predetermined frequency is detected and demodulated by a detection and rectifier circuit 134. Next, the time code is taken out via a wave shaping circuit 135 and is counted by a CPU 136. In the CPU 136, information such as current year, accumulated date, day of the week, and time is read. The read information is reflected in an RTC 137 and the correct time information is displayed.

Since the transport waves are 40 KHz or 60 KHz, a vibrator having the above-mentioned tuning fork type structure is suitable for the crystal vibrator portions 138 and 139.

In addition, the aforementioned explanation was shown by an example in Japan, but the frequencies of the standard radio waves of the long waves differ in foreign countries. For example, standard radio waves of 77.5 KHz are used in Germany. Thus, in a case where the radio-controlled timepiece 130 capable of coping in foreign countries is built in a mobile phone, there is a need for the piezoelectric vibrator 1 having a different frequency from the case in Japan.

Moreover, in the present embodiment, since the piezoelectric vibrator 1 having an improved throughput is included, the cost of the radio-controlled timepiece 130 can be reduced.

In addition, the technical scope of the invention is not limited to the above embodiments but various modifications can be added within a scope without departing from the gist of the invention. That is, the specific material, the configuration or the like given in the present embodiments is merely one example, and suitable changes can be made.

For example, in the above-mentioned embodiment (see FIGS. 8A to 8D), the width c1 and the thickness c4 of the middle portion 70c of the getter material 70 are greater than the width e1 and the thickness e4 of the end portion 70e, but only any one of the widths or thicknesses may be greater.

Furthermore, in the above-mentioned embodiments, the distance e2 form the vibration arm portion 10 to the end portion 70e of the getter material 70 is greater than the distance c2 up to the middle portion 70c. However, by equally forming the distance e2 and the distance c2, the end portion 70e may be gettered in a position (in the outside of the Y direction) separated from the vibration arm portion 10. However, if the distance e2 is greater than the distance c2, the material of the getter material can be saved.

Furthermore, in the above-mentioned embodiments, the getter material 70 is formed in the axisymmetric shape with respect to the center line Ly, the getter material 70 may be gettered so as to be axisymmetric by being formed in a non-axisymmetric shape.

Furthermore, in the above-mentioned embodiment (see FIG. 4), the getter material 70 is formed on the surface of the base substrate 2, but it may be formed on the surface of the lid substrate 3. However, as in the above-mentioned embodiment, by forming the getter material 70 in the base substrate side, it is possible to form the getter material concurrently with the lead-out electrodes 36 and 37 and the bonding film 35, whereby the manufacturing process can be simplified to reduce the manufacturing cost.

Furthermore, in the above-mentioned embodiments, as an example of the piezoelectric vibrating reed 4, the piezoelectric vibrating reed 4 with grooves in which the groove portions 18 are formed on both surfaces of the vibration arm portions 10 and 11 is described, but it may be a type of piezoelectric vibrating reed without the groove portions 18. However, by forming the grove portions 18, when a predetermined voltage is applied to the pair of excitation electrodes 15, the electric field efficiency between the pair of excitation electrodes 15 can be improved, which can further suppress the vibration loss and further improve the vibration property. That is, the CI value (Crystal Impedance) can be further reduced and the high performance of the piezoelectric vibrating reed 4 can be further promoted. Given this point, it is desirable to form the groove portions 18.

Furthermore, while in the above-mentioned embodiments, the base substrate 2 and the lid substrate 3 are anode-bonded via the bonding film 35, the invention is not limited to anode-bonding. However, anode-bonding is desirable in that both substrates 2 and 3 can be strongly bonded by the anode-bonding.

Moreover, while in the above-mentioned embodiment, the piezoelectric vibrating reed 4 was bump-bonded, the invention is not limited to bump-bonding. For example, the piezoelectric vibrating reed 4 may be bonded by a conductive adhesive. However, the piezoelectric vibrating reed 4 can float from the upper surface of the base substrate 2 by bump-bonding, whereby it is possible to naturally secure the minimum vibration gap that is necessary for the vibration. Thus, bump-bonding is desirable in this point.

Industrial Applicability

With the piezoelectric vibrator according to the invention, only by gettering the middle portion, a great quantity of getter material can be activated, and the degree of vacuum in the package can be secured. In addition, only by gettering the middle portion, the product due to the gettering is mainly attached to the center portion of the vibration arm portion. Thus, it is possible to suppress any fluctuations in frequency due to the gettering.

Furthermore, with the method of manufacturing the piezoelectric vibrator according to the invention, since the first gettering process of activating the middle portion is performed in advance, it is possible to attach the product due to the gettering as near the center portion of the vibration arm portion as possible. Thus, any fluctuations in frequency due to the gettering can be suppressed.

What is claimed is:

1. A piezoelectric vibrator comprising:
   a tuning fork type piezoelectric vibrating reed including a pair of vibration arm portions;
   a package that accommodates the piezoelectric vibrating reed; and
   a getter material that is formed along a longitudinal direction of the vibration arm portion in an inner portion of the package,
   wherein a cross-sectional area of a middle portion of the getter material adjacent to a center portion of the longitudinal direction of the vibration arm portion is greater than that of an end portion of the getter material.

2. The piezoelectric vibrator according to claim 1, wherein the width of the middle portion of the getter material is greater than that of the end portion of the getter portion.

3. The piezoelectric vibrator according to claim 1, wherein the thickness of the middle portion of the getter material is greater than that of the end portion of the getter material.

4. The piezoelectric vibrator according to claim 1, wherein the getter material is arranged at the outside of the pair of vibration arm portions in a width direction of the piezoelectric vibrating reed, and wherein the distance from the vibration arm portions to the end portion of the getter material is greater than that from the vibration arm portions to the middle portion of the getter material.

5. A method of manufacturing a piezoelectric vibrator, which includes a tuning fork type piezoelectric vibrating reed that includes a pair of vibration arm portions, a package that accommodates the piezoelectric vibrating reed, and a getter material that is formed along a longitudinal direction of the vibration arm portions in an inner portion of the package, the method comprising:
   a first gettering process comprising activating a middle portion of the getter material adjacent to center portions of a longitudinal direction of the vibration arm portions; and
   a second gettering process comprising activating an end portion of the getter material,
   such that a cross-sectional area of a middle portion of the getter material adjacent to a center portion of the longitudinal direction of the vibration arm portion is greater than that of an end portion of the getter material.

6. The method of manufacturing the piezoelectric vibrator according to claim 5 wherein, in the second gettering process, both end portions of the getter material is activated so as to be axisymmetric to center lines of the longitudinal direction of the vibration arm portions.

7. An oscillator in which the piezoelectric vibrator according to claims 1 is electrically connected to an integrated circuit as an oscillating element.

8. An electronic equipment in which the piezoelectric vibrator according to claims 1 is electrically connected to a measurement portion.

9. A radio-controlled time piece in which the piezoelectric vibrator according to claims 1 is electrically connected to a filter portion.

* * * * *